US011380623B2

(12) United States Patent
Shekhar et al.

(10) Patent No.: US 11,380,623 B2
(45) Date of Patent: Jul. 5, 2022

(54) SHIELD TO PROTECT VIAS FROM ELECTROMAGNETIC INTERFERENCE

(71) Applicant: Intel Corporation, Santa Clara, CA (US)

(72) Inventors: Sameer Shekhar, Portland, OR (US); Chin Lee Kuan, Pahang (MY); Amit Kumar Jain, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 924 days.

(21) Appl. No.: 15/939,162

(22) Filed: Mar. 28, 2018

(65) Prior Publication Data

US 2019/0304923 A1 Oct. 3, 2019

(51) Int. Cl.
*H01L 23/552* (2006.01)
*H01L 23/00* (2006.01)
*H01L 23/498* (2006.01)
*H01F 27/36* (2006.01)
*H05K 9/00* (2006.01)

(52) U.S. Cl.
CPC ......... *H01L 23/552* (2013.01); *H01F 27/363* (2020.08); *H01F 27/366* (2020.08); *H01L 23/49827* (2013.01); *H01L 24/32* (2013.01); *H01L 2924/01029* (2013.01); *H01L 2924/1437* (2013.01); *H01L 2924/3025* (2013.01); *H05K 9/0024* (2013.01)

(58) Field of Classification Search
CPC ..... H01L 23/49827; H01L 2225/06548; H01L 23/552–556; H01L 2924/3025; H01F 2017/002
See application file for complete search history.

(56) References Cited

U.S. PATENT DOCUMENTS

| 2013/0154066 | A1* | 6/2013 | Kim | ................. H01L 21/50 257/659 |
| 2016/0190113 | A1* | 6/2016 | Sharan | ................. H01L 25/16 257/531 |
| 2018/0033736 | A1* | 2/2018 | Lin | ................. H01L 23/3114 |

* cited by examiner

*Primary Examiner* — Amar Movva
(74) *Attorney, Agent, or Firm* — Schwabe, Williamson & Wyatt P.C.

(57) ABSTRACT

Embodiments herein relate to a package having a substrate with a core layer with a plurality of conductors coupling a first side of the core layer with a second side of the core layer, and a shield within the core layer that separates a first conductor of the plurality of conductors from a second conductor of the plurality of conductors where the shield is to reduce electromagnetic interference received by the second conductor that is generated by the first conductor. Embodiments may also be related to a package having a substrate with a through hole via through the substrate, where an EMI protective material is applied to a surface of the substrate that forms the via to shield an inner portion of the via.

17 Claims, 5 Drawing Sheets

SHIELD TO PROTECT VIAS FROM ELECTROMAGNETIC INTERFERENCE

FIELD

Embodiments of the present disclosure generally relate to the field of package assemblies, and in particular protecting through hole vias (THV) in a package from electromagnetic interference (EMI).

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

As the demand for greater functionality within electronic devices continues, there will be an increase in the number of components within a package in addition to a decrease in the space between subcomponents within the package.

DETAILED DESCRIPTION

Figure 1:
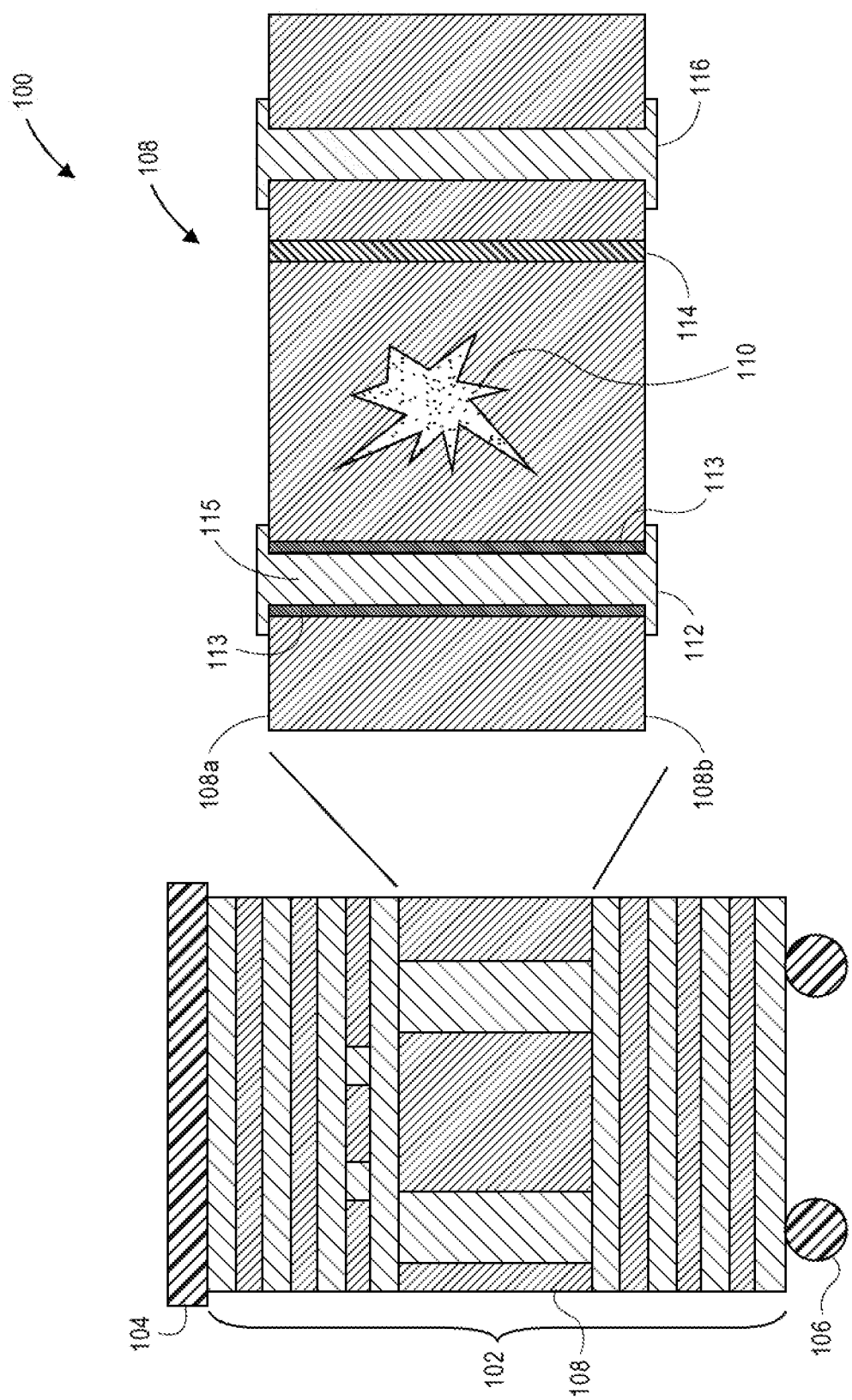
FIG. 1 illustrates an example of a package with a core that has a coated THV and a wall to protect a THV from EMI, in accordance with embodiments.

Embodiments of the present disclosure generally relate to coated or plated THVs to shield the THVs from EMI emitted from aggressor components, such as a fully integrated voltage regulator (FIVR), switch, or some other aggressor component. Embodiments may also be related to shielding to prevent coupling to power planes and signal lines. Embodiments may also generally relate to a shielding wall, such as a metallic sheet, placed within or between package layers between the victim component and aggressor component. Embodiments may also generally relate to a wall enclosing one or more aggressor components, such as FIVR air-core inductors (ACI) or snake inductors, with EMI absorbing material fill placed within the enclosure and around the aggressor components. In embodiments, the shielding wall may also serve as a core package stiffener.

The density of EMI aggressor components within packages is likely to increase. For example, FIVRs with ACIs or snake inductors may introduce aggressive voltage swings in a package on both input and output voltage. Tighter placement of aggressor components and victim components will increase significant inductive and capacitive coupling effects on victim components. For example, these effects may reduce transfer rates for high speed input/output (HSIO) (e.g., PCIe), or introduce EMI noise coupling in VCCIO rail powering for double data rate (DDR) pre-driver circuitry for memory interfaces. EMI flux, and inductive and capacitive coupling, may affect signal transmission through conductors in THVs and micro Vias (uVias).

Embodiments of the present disclosure may improve suppression of flux and inductive and capacitive coupling via coating and/or plating of THVs with magnetic and/or EMI absorbing material. Embodiments may include isolating aggressors such as FIVR inductors with one or more package core embedded metallic plates that may act as both an EMI shield and a package stiffener.

Embodiments may allow tighter die integration and DDRs, including high speed DDR memory. Embodiments may also help reduce overall EMI radiation emitted from a package.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an application specific integrated circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Various figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the figures, and sizes, thicknesses, or dimensions may be assumed for some embodiments only where specifically indicated or discussed.

FIG. 1 illustrates an example of a package with a core layer that has a coated THV and a shielding wall to protect THVs from EMI, in accordance with embodiments. Diagram 100 shows a package that may include a die 104 attached to a series of package layers 102 that may include core layer 108. In embodiments, core layer 108 may include multiple layers used as the core layer 108. The package layers 102 may be attached to one or more solder balls 106 that may electrically connect the die 104 and package layers 102 with a mother board (not shown) or with some other component (not shown).

In embodiments, core layer 108 may include an EMI noise source 110. In embodiments, EMI noise source 110 may be a FIVR component or some other component that may be a source of aggressor EMI noise. EMI noise may include, but is not limited to, electromagnetic flux, aggressor electromagnetic waveforms, inductive coupling, or capacitive coupling and electromagnetic radiation. In embodiments, the EMI noise source 110 may be located within a core layer 108 (as shown), or may be proximate to the core layer 108. In embodiments, references herein to a core layer 108 may also apply to any package layer 102.

In embodiments, a THV 112 may electrically couple a first side 108a of the core layer 108 with a second side 108b. In embodiments, the THV 112 may include a coating 113 to reduce EMI noise from the EMI noise source 110. In embodiments, the coating 113 may be of a material to either shield or absorb EMI from reaching the conductor 115. The coating 113 may include a magnetic material, or may include an EMI absorbing material such as soft metal flakes in a polymer resin, or a ring of metal (e.g. a cylinder) around the THV 112. In embodiments, the coating 113 may coat only a part of the THV 112. In one example, the coating 113 may only be on a side of the THV 112, for example, that is nearest to the EMI noise source 110. In another example, the coating 113 may extend only part of the way up or down the THV 112 (not shown).

In embodiments, the thickness of the coating 113, which may also be referred to as the skin depth based coating, may vary depending upon the characteristics of the EMI noise frequency emitted from the EMI noise source 110. For example, EMI noise emitted from a 140 MHz FIVR switch may be absorbed by a 5.5 micrometer (µm) thick layer of coating 113. In another example, noise emitted from a 4000 MHz frequency DDR clock may be absorbed by a 1 µm thick layer of coating. In embodiments, the thickness of the layer of coating 113 may also vary along the THV 112 depending on the sources and direction of expected aggressor electromagnetic waveforms.

In embodiments, the conductor 115, which may include, for example, copper or a copper alloy, may be inserted within the coating 113 to provide an electrical coupling between the first side 108a and the second side 108b of the core layer 108. The conductor 115 may be solid, or may be a plated conductor over the coating 113, which may have a hole (not shown) through the length of the conductor 115 within the THV 112.

In embodiments, a shielding wall 114 may be used to shield a second THV 116 from EMI noise generated by the EMI noise source 110. In embodiments, the shielding wall 114 may be made of a metal shielding or EMI absorbing material, and may be dimensioned so that the THV 116 may be appropriately shielded. In embodiments, the shielding wall 114 may also provide structural stability for the package 100.

In embodiments, the shielding wall 114 may have a planar shape and may extend from the first side 108a to the second side 108b of the core layer 108. The wall may have other dimensions, such as a curved shape or a stepped shape. The wall may also be multiple walls that may be connected together. For example, a first shielding wall 114 may be connected to a second wall (not shown) along the first side 108a of a core layer 108 and/or may be connected to a third wall (not shown) along the second side 108b of the core layer 108. Other configurations may include other shielding walls in other orientations to provide EMI shielding or protection for package 100 components or features such as THV 116. Configurations may include a metallic box. In embodiments described further in FIG. 5, multiple walls may be used to isolate aggressor components that produce EMI noise/interference.

Figure 2:
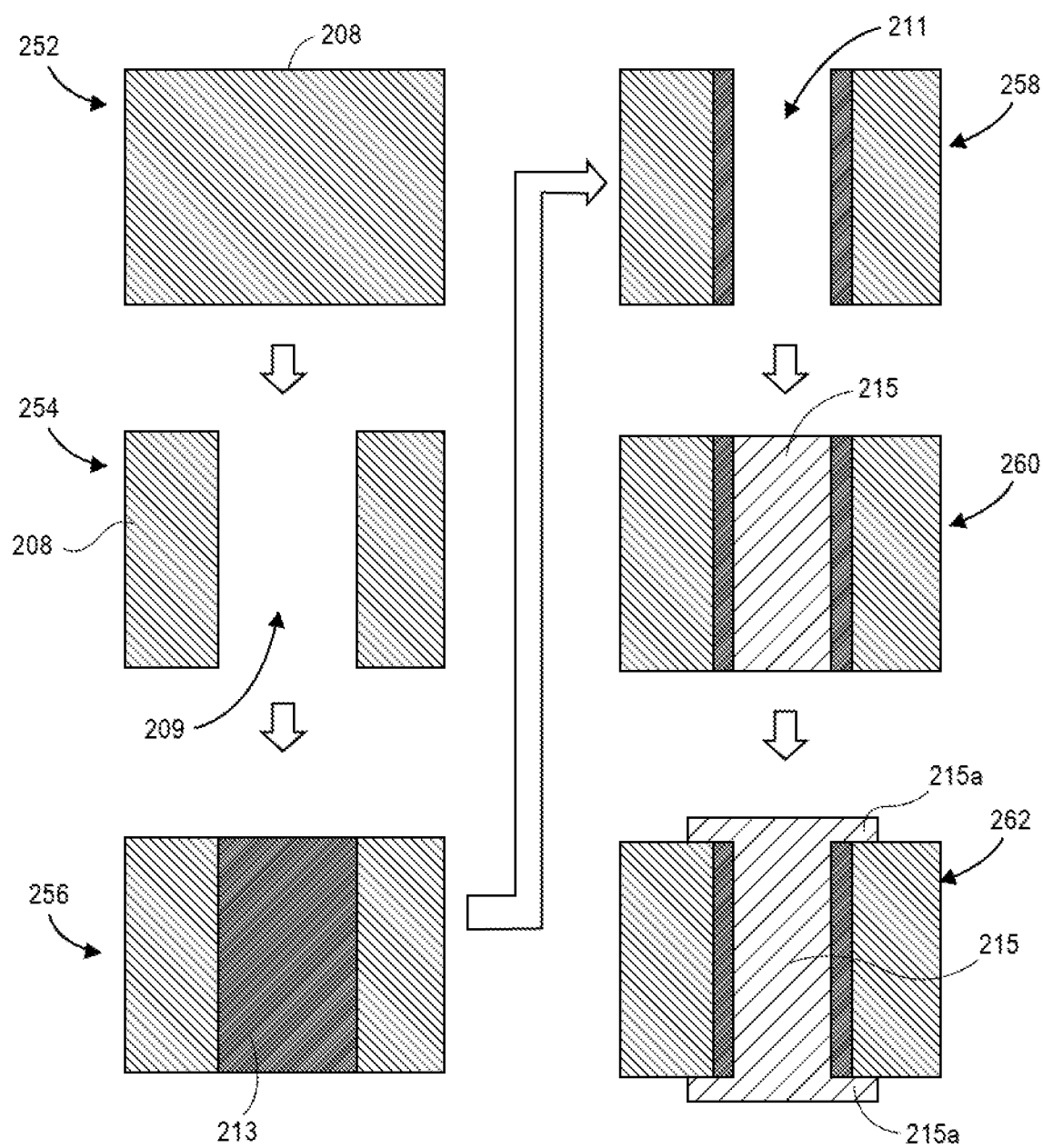
FIG. 2 illustrates an example of a coated THV at various stages of a manufacturing process, in accordance with embodiments.

FIG. 2 illustrates an example of a coated THV at various stages of a manufacturing process, in accordance with embodiments. Diagrams 252-262 depict examples of a package at various stages of the manufacturing process to create a coated THV. In embodiments, one or more elements may be introduced in an earlier diagram, for example, diagram 252, and then assume to carry over to later diagrams, such as diagram 262. Therefore, each and every element may not be labeled in each and every stage of diagrams 252-262 for sake of clarity and ease of understanding.

Diagram 252 may show a package assembly embodiment that includes a substrate 208 that may be similar to the core layer 108 of FIG. 1.

Next, as shown in diagram 254, a hole 209 may be drilled into the substrate 208. In embodiments, the hole 209 may result from a drilling, a laser drilling, or an etching process.

Next, as shown in diagram 256, magnetic material 213, which may be similar to coating 113 of FIG. 1, may be placed into hole 209. As a part of the filling process, the magnetic material 213 may adhere to sides of the substrate 208 that define the hole 209.

Next, as shown in diagram 258, the magnetic material 213 may be drilled out, leaving a hole 211. In embodiments, the magnetic material 213 may be drilled using a laser drill or a mechanical drill.

Next, as shown in diagram 260, a conductor 215, which may be similar to conductor 115 of FIG. 1, may be inserted into the drilled hole 211. In embodiments, the conductor 215 may include copper or a copper alloy. Other conductive material may be used, for example, gold.

Next, as shown in diagram 262, a cap 215a may be added that connects to the conductor 215 and that may partially overlap the substrate 208. The cap 215a may be used to couple with the redistribution layer (RDL) or other circuitry above or below the substrate 208.

Figure 3:
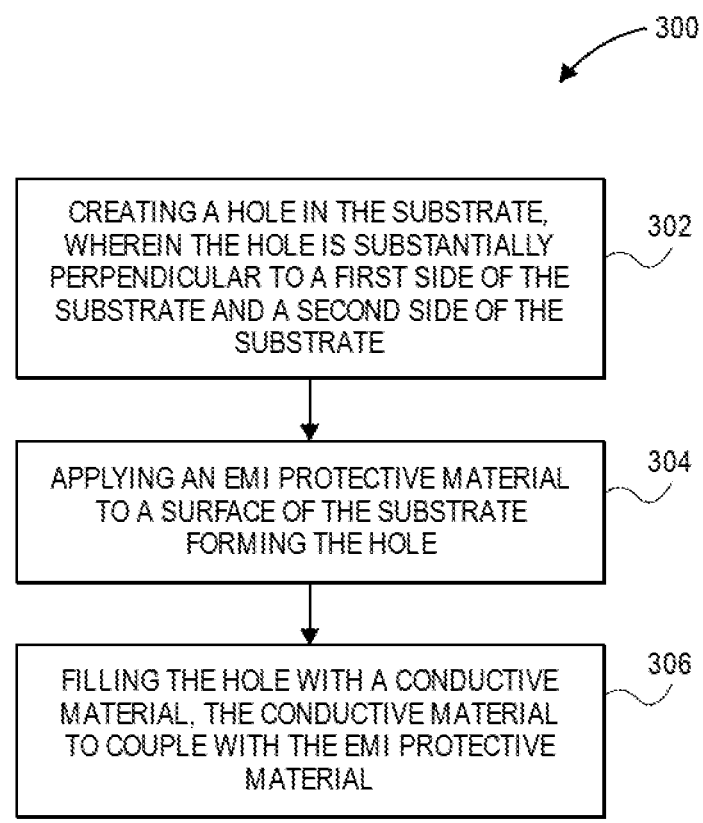
FIG. 3 illustrates an example of a process for manufacturing a coated THV within a package assembly, in accordance with embodiments.

FIG. 3 illustrates an example of a process for manufacturing a coated THV within a package assembly, in accordance with embodiments. Process 300 may be used for manufacturing a package with a coated THV, such as coated THV 112 of FIG. 1.

At block 302, the process may include creating a hole in the substrate, wherein the hole is substantially perpendicular to a first side of the substrate and a second side of the substrate. In embodiments, the substrate may be similar to layer 108 having a first side 108a and a second side 108b of FIG. 1. The hole in the substrate may be similar to hole 209 of FIG. 2. In embodiments, the hole may be created by a laser drill or a physical drill, or may be created using an etching process. In embodiments, the substrate may include multiple substrates where the THV may pass through multiple substrate layers.

At block 304, the process may include applying an EMI protective material to a surface of the substrate forming the hole. In embodiments, the EMI protective material may be similar to a magnetic material 213 of FIG. 2, or an EMI shielding material as described with respect to coating 113 of FIG. 1. In embodiments, the EMI protective material may be applied to only part of the substrate that forms the hole. In embodiments, the EMI protective material may be applied to fill the entire hole, and then a portion of the EMI may be removed through drilling. In embodiments, a coating layer, such as is shown at coating 113, may be directly applied to part of the substrate forming the hole. In embodiments, a varied thickness of the layer of shielding material, as discussed above, may be applied based upon the frequency of the EMI noise to be protected against.

At block 306, the process may include filling the hole with a conductive material, the conductive material to couple with the EMI protective material. As a result of filling the hole, a conductor, which may be similar to conductor 115 of FIG. 1, may be formed, and may be protected from EMI noise such as EMI noise 110 of FIG. 1. In embodiments, the conductor may include a copper or a copper alloy.

Figure 4:
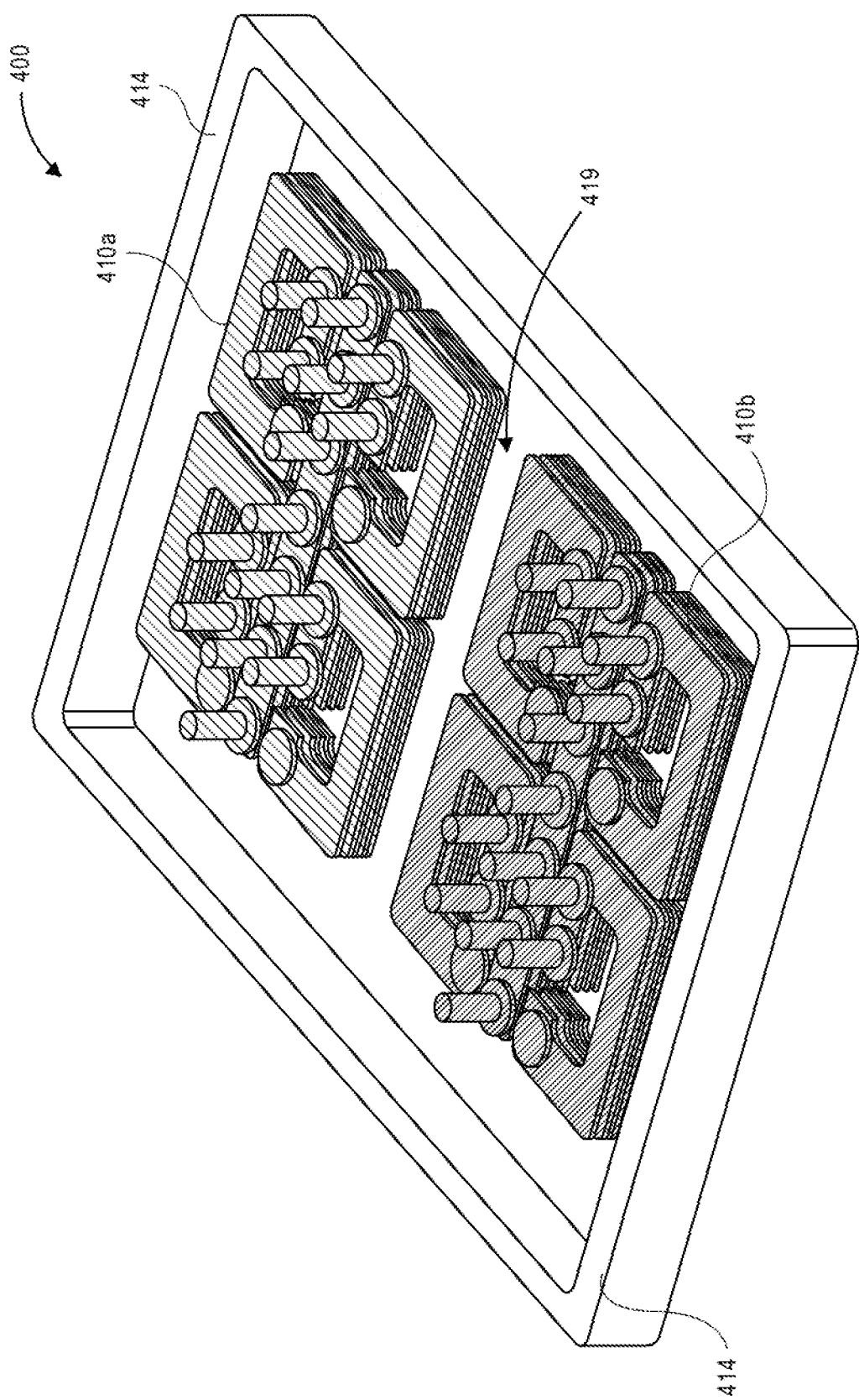
FIG. 4 illustrates an example of a wall within a package to isolate aggressor components emitting EMI, in accordance with embodiments.

FIG. 4 illustrates an example of a wall within a package to isolate aggressor components emitting EMI, in accordance with embodiments. Diagram 400 shows a wall 414 that may be similar to shielding wall 114 of FIG. 1. The wall 414 may be part of a substrate or layer, such as layer 108 of FIG. 1, or may span multiple substrates. In embodiments, the wall 414 may surround aggressor components that may emit EMI noise, such as EMI noise source 110 of FIG. 1. In embodiments, the height of the wall 414 may span the height of the layer, such as core layer 108, within a package or may span multiple layers within a package. The wall 414 may include a metal sheet or other EMI absorbing or protective material.

As shown, the wall 414 surrounds two FIVR components 410a, 410b. During operation, the FIVR components may emit EMI aggressor waveforms and may cause, for example, inductive and capacitive coupling in nearby components (not shown), such as DDRs. The FIVR components 410a, 410b may include air-core inductors (ACI) that generate EMI. In embodiments, the wall 414 may include a floor (not shown) or a ceiling (not shown) to create an enclosure in which the FIVR components 410a, 410b may be enclosed.

In embodiments, a filler material (not shown) may be inserted into the open area 419 within the wall 414 and around the FIVR components 410a, 410b. In embodiments, this material (not shown) may have EMI absorptive and/or EMI blocking properties.

Figure 5:
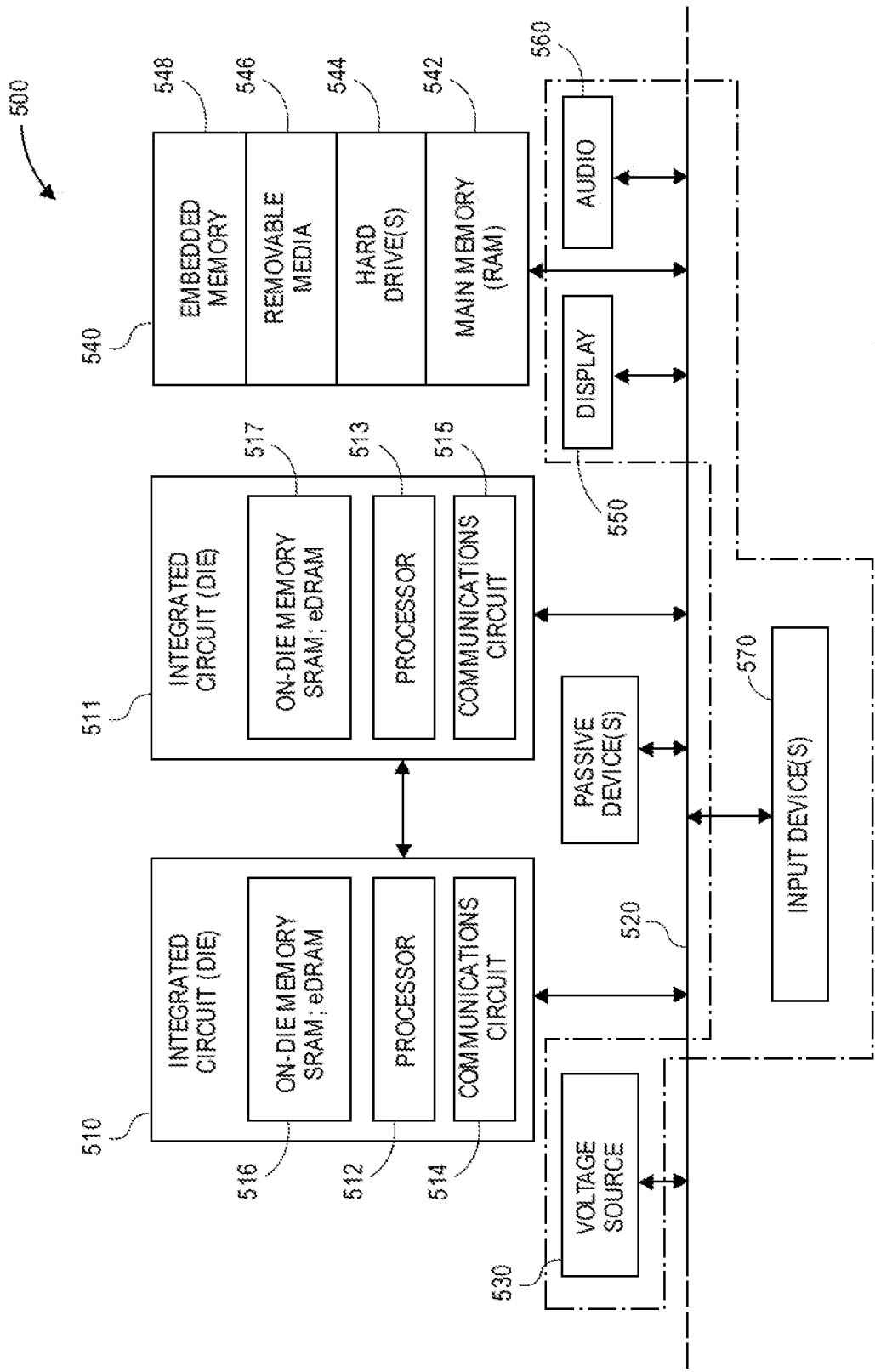
FIG. 5 is a schematic of a computer system, in accordance with embodiments.

FIG. 5 is a schematic of a computer system 500, in accordance with an embodiment of the present invention. The computer system 500 (also referred to as the electronic system 500) as depicted can embody a shield to protect THVs from EMI, according to any of the several disclosed embodiments and their equivalents as set forth in this disclosure. The computer system 500 may be a mobile device such as a netbook computer. The computer system 500 may be a mobile device such as a wireless smartphone. The computer system 500 may be a desktop computer. The computer system 500 may be a hand-held reader. The computer system 500 may be a server system. The computer system 500 may be a supercomputer or high-performance computing system.

In an embodiment, the electronic system 500 is a computer system that includes a system bus 520 to electrically couple the various components of the electronic system 500. The system bus 520 is a single bus or any combination of busses according to various embodiments. The electronic system 500 includes a voltage source 530 that provides power to the integrated circuit 510. In some embodiments, the voltage source 530 supplies current to the integrated circuit 510 through the system bus 520.

The integrated circuit 510 is electrically coupled to the system bus 520 and includes any circuit, or combination of circuits, according to an embodiment. In an embodiment, the integrated circuit 510 includes a processor 512 that can be of any type. As used herein, the processor 512 may mean any type of circuit such as, but not limited to, a microprocessor, a microcontroller, a graphics processor, a digital signal processor, or another processor. In an embodiment, the processor 512 includes, or is coupled with, a shield to protect THVs from EMI, as disclosed herein. In an embodiment, SRAM embodiments are found in memory caches of the processor. Other types of circuits that can be included in the integrated circuit 510 are a custom circuit or an application-specific integrated circuit (ASIC), such as a communications circuit 514 for use in wireless devices such as cellular telephones, smartphones, pagers, portable computers, two-way radios, and similar electronic systems, or a communications circuit for servers. In an embodiment, the integrated circuit 510 includes on-die memory 516 such as static random-access memory (SRAM). In an embodiment, the integrated circuit 510 includes embedded on-die memory 516 such as embedded dynamic random-access memory (eDRAM).

In an embodiment, the integrated circuit 510 is complemented with a subsequent integrated circuit 511. Useful embodiments include a dual processor 513 and a dual communications circuit 515 and dual on-die memory 517 such as SRAM. In an embodiment, the dual integrated circuit 510 includes embedded on-die memory 517 such as eDRAM.

In an embodiment, the electronic system 500 also includes an external memory 540 that in turn may include one or more memory elements suitable to the particular application, such as a main memory 542 in the form of RAM, one or more hard drives 544, and/or one or more drives that handle removable media 546, such as diskettes, compact disks (CDs), digital variable disks (DVDs), flash memory drives, and other removable media known in the art. The external memory 540 may also be embedded memory 548 such as the first die in a die stack, according to an embodiment.

In an embodiment, the electronic system 500 also includes a display device 550 and an audio output 560. In an embodiment, the electronic system 500 includes an input device such as a controller 570 that may be a keyboard, mouse, trackball, game controller, microphone, voice-recognition device, or any other input device that inputs information into the electronic system 500. In an embodiment, an input device 570 is a camera. In an embodiment, an input device 570 is a digital sound recorder. In an embodiment, an input device 570 is a camera and a digital sound recorder.

As shown herein, the integrated circuit 510 can be implemented in a number of different embodiments, including a package substrate having a shield to protect THVs from EMI, according to any of the several disclosed embodiments and their equivalents, an electronic system, a computer system, one or more methods of fabricating an integrated circuit, and one or more methods of fabricating an electronic assembly that includes a package substrate having a shield to protect THVs from EMI, according to any of the several disclosed embodiments as set forth herein in the various embodiments and their art-recognized equivalents. The elements, materials, geometries, dimensions, and sequence of operations can all be varied to suit particular I/O coupling requirements including array contact count and array contact configuration for a microelectronic die embedded in a processor mounting substrate according to any of the several disclosed package substrates having a shield to protect THVs from EMI embodiments and their equivalents. A foundation substrate may be included, as represented by the dashed line of FIG. 5. Passive devices may also be included, as is also depicted in FIG. 5.

EXAMPLES

Example 1 may be a package comprising: a substrate; a through-hole via (THV) through the substrate; and an electromagnetic interference (EMI) protective material applied to a surface of the substrate that forms the THV, wherein the material is to shield an inner portion of the THV from EMI radiation.

Example 2 may include the subject matter of example 1, or of any other example herein, wherein the substrate is a package core layer.

Example 3 may include the subject matter of example 1, or of any other example herein, wherein the THV is a micro through-hole via.

Example 4 may include the subject matter of example 1, or of any other example herein, wherein the EMI protective material applied to the surface of the substrate that forms the THV is plated or coated to the surface of the substrate that forms the THV.

Example 5 may include the subject matter of example 1, or of any other example herein, wherein the EMI protective material is on a portion of the substrate surface that forms the THV.

Example 6 may include the subject matter of example 1, or of any other example herein, wherein the EMI protective material is a selected one of a magnetic material or an EMI absorbing material.

Example 7 may include the subject matter of example 1, or of any other example herein, wherein a thickness of the EMI protective material applied to the surface of the substrate that forms the THV is based on characteristics or proximity of the EMI radiation to be received by the THV.

Example 8 may include the subject matter of example 1, or of any other example herein, further comprising a conductor in the THV coupled to the EMI protective material.

Example 9 may include the subject matter of example 8, or of any other example herein, wherein the conductor is a selected one of copper or copper alloy.

Example 10 may include the subject matter of example 1, or of any other example herein, wherein the EMI radiation is a form of magnetic flux, inductive coupling, or capacitive coupling.

Example 11 may include the subject matter of example 1, or of any other example herein, wherein the EMI radiation is generated by a fully integrated voltage regular (FIVR) or switches.

Example 12 may include a package comprising: a substrate with a core layer; a plurality of conductors coupling a first side of the core layer with a second side of the core layer that is opposite the first side; a shield within the core layer that separates a first conductor of the plurality of conductors from a second conductor of the plurality of conductors; and wherein the shield is to reduce electromagnetic interference (EMI) received by the second conductor that is generated by the first conductor.

Example 13 may include the subject matter of example 12, or of any other example herein, wherein the shield includes magnetic material or EMI absorbing material.

Example 14 may include the subject matter of example 12, or of any other example herein, wherein the shield is a metallic sheet.

Example 15 may include the subject matter of example 14, or of any other example herein, wherein the shield is substantially perpendicular to the first side of the core layer and the second side of the core layer.

Example 16 may include the subject matter of example 15, or of any other example herein, wherein the shield extends substantially from the first side of the core layer to the second side of the core layer.

Example 17 may include the subject matter of example 15, or of any other example herein, wherein the shield provides structural support for the package.

Example 18 may include the subject matter of example 15, or of any other example herein, wherein the shield is a first wall of the shield; and the package further comprises a second wall of the shield connected to the first wall, the second wall substantially perpendicular to the first wall and substantially parallel to the first side of the core layer.

Example 19 may include the subject matter of example 18, or of any other example herein, wherein the second wall is substantially at the first side of the core layer.

Example 20 may include the subject matter of example 12, or of any other example herein, wherein the first conductor is part of a fully integrated voltage regulator (FIVR).

Example 21 may include the subject matter of example 20, or of any other example herein, wherein the shield substantially surrounds air-core inductors or snake inductors of the FIVR.

Example 22 may include the subject matter of example 21, or of any other example herein, further comprising EMI absorbing fill material proximate to the inductors.

Example 23 may include the subject matter of example 22, or of any other example herein, further comprising the EMI absorbing fill material within the shield.

Example 24 may include the subject matter of example 12, or of any other example herein, wherein the first conductor is coupled with a switch.

Example 25 may include the subject matter of example 12, or of any other example herein, wherein the second conductor is a VCCIO lead.

Example 26 may include the subject matter of example 12, or of any other example herein, wherein the conductors are in a through-hole via.

Example 27 may be a method for creating a shielded vertical interconnect in a substrate, comprising: creating a hole in the substrate, wherein the hole is substantially perpendicular to a first side of the substrate and a second side of the substrate; applying an electromagnetic interference (EMI) protective material to a surface of the substrate forming the hole; and filling the hole with a conductive material, the conductive material to couple with the EMI protective material.

Example 28 may include the subject matter of example 27, or of any other example herein, wherein creating a hole in the substrate further includes a selected one of drilling the hole or etching the hole into the substrate.

Example 29 may include the subject matter of example 28, or of any other example herein, wherein drilling the hole further includes drilling the hole using a laser.

Example 30 may include the subject matter of example 27, or of any other example herein, wherein applying the EMI protective material to a substrate surface of the hole further includes a selected one of plating the substrate surface of the hole with the EMI protective material or coating the substrate surface of the hole with the EMI protective material.

Example 31 may include the subject matter of example 27, or of any other example herein, wherein applying the EMI protective material further includes: filling the hole with the EMI protective material; and removing a portion of the EMI protective material.

Example 32 may include the subject matter of example 27, or of any other example herein, wherein the EMI protective material is a magnetic material or an EMI absorbing material.

Example 33 may include the subject matter of example 27, or of any other example herein, wherein the conductive material further includes copper or a copper alloy.

Example 34 may include the subject matter of example 27, or of any other example herein, further comprising capping the conductive material on the first side of the substrate or the second side of the substrate.

Example 35 may be an apparatus, comprising: means for creating a hole in the substrate, wherein the hole is substantially perpendicular to a first side of the substrate and a second side of the substrate; means for applying an electromagnetic interference (EMI) protective material to a surface of the substrate forming the hole; and means for filling the hole with a conductive material, the conductive material to couple with the EMI protective material.

Example 36 may include the subject matter of example 35, or of any other example herein, wherein means for creating a hole in the substrate further includes a selected one of means for drilling the hole or means for etching the hole into the substrate.

Example 37 may include the subject matter of example 36, or of any other example herein, wherein means for drilling the hole further includes means for drilling the hole using a laser.

Example 38 may include the subject matter of example 35, or of any other example herein, wherein means for applying the EMI protective material to a substrate surface of the hole further includes a selected one of means for plating the substrate surface of the hole with the EMI protective material or means for coating the substrate surface of the hole with the EMI protective material.

Example 39 may include the subject matter of example 35, or of any other example herein, wherein means for applying the EMI protective material further includes: means for filling the hole with the EMI protective material; and means for removing a portion of the EMI protective material.

Example 40 may include the subject matter of example 35, or of any other example herein, wherein the EMI protective material is a magnetic material or an EMI absorbing material.

Example 41 may include the subject matter of example 35, or of any other example herein, wherein the conductive material further includes copper or a copper alloy.

Example 42 may include the subject matter of example 35, or of any other example herein, further comprising means for capping the conductive material on the first side of the substrate or the second side of the substrate.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. A package comprising:
    a substrate with a first side and a second side opposite the first side;
    a plurality of electronic components within the substrate, wherein at least one of the plurality of electronic components generate electromagnetic interference (EMI) during operation;
    a wall disposed within the substrate, the wall distinct from the substrate and comprising EMI protective material, the wall extending from the first side of the substrate to the second side of the substrate, the wall fully enclosing the at least one of the plurality of electronic components; and
    wherein the wall shields another of the plurality of electronic components that is not enclosed by the wall from EMI radiation generated by the at least one of the plurality of electronic components during operation.

2. The package of claim 1, wherein the substrate is a package core layer.

3. The package of claim 1, wherein the wall includes only EMI protective material.

4. The package of claim 1, wherein the EMI protective material disposed within the wall is plated or coated to a surface of the wall.

5. The package of claim 1, wherein the EMI protective material is further disposed on a portion of the first side of the substrate or the second side of the substrate proximate to the wall.

6. The package of claim 1, wherein the EMI protective material is a selected one of: a magnetic material or an EMI absorbing material.

7. The package of claim 1, wherein a thickness of the EMI protective material within the wall is based on characteristics of the EMI radiation emitted by the one or more electronic components.

8. The package of claim 1, wherein the EMI radiation is a form of magnetic flux, inductive coupling, or capacitive coupling.

9. The package of claim 1, wherein the EMI radiation is generated by a selected one or more of: a fully integrated voltage regular (FIVR) or switches.

10. The package of claim 9, further comprising EMI absorbing fill material proximate to the FIVR and within a volume within the package bounded by the wall.

11. A package comprising:
   a substrate with a core layer;
   a first through hole via (THV) that includes a first electrical conductor and a second THV that includes a second electrical conductor, the first electrical conductor and the second electrical conductor electrically coupling a first side of the core layer with a second side of the core layer opposite the first side of the core layer, wherein the core layer is a single continuous layer;
   a wall disposed within the core layer distinct from the core layer and surrounding the first THV and the second THV, the wall comprising electromagnetic interference (EMI) protective material, the wall extending from the first side of the substrate to the second side of the substrate; and
   wherein the wall forms a plane that is perpendicular to the first side of the core layer, wherein the wall reduces EMI received by a third THV that includes a third electrical conductor that electrically couples the first side of the core layer with the second side of the core layer generated by the second electrical and by the first electrical conductor during operation.

12. The package of claim 11, wherein the wall includes a selected one of: a magnetic material or EMI absorbing material.

13. The package of claim 11, wherein the wall is a metallic sheet.

14. The package of claim 13, wherein the wall is substantially perpendicular to the first side of the core layer and the second side of the core layer.

15. The package of claim 14, wherein the wall extends substantially from the first side of the core layer to the second side of the core layer.

16. The package of claim 14, wherein the wall provides structural support for the package.

17. The package of claim 11, wherein the first conductor is part of a fully integrated voltage regulator (FIVR).

* * * * *